United States Patent
Bartholf et al.

(10) Patent No.: US 7,118,817 B2
(45) Date of Patent: Oct. 10, 2006

(54) COIN CELL PROTECTION AGAINST REVERSE INSERTION IN CELL HOLDER

(75) Inventors: Joel Bartholf, Macon, GA (US); Michael Larry Poorbaugh, Lakeland, FL (US)

(73) Assignee: 3SI Security Systems, Inc., Exton, PA (US)

( * ) Notice: Subject to any disclaimer, the term of this patent is extended or adjusted under 35 U.S.C. 154(b) by 266 days.

(21) Appl. No.: 10/656,737

(22) Filed: Sep. 5, 2003

(65) Prior Publication Data

US 2004/0076858 A1 Apr. 22, 2004

Related U.S. Application Data

(60) Provisional application No. 60/408,355, filed on Sep. 5, 2002.

(51) Int. Cl.
*H01M 2/10* (2006.01)
(52) U.S. Cl. .................. 429/1; 429/96; 429/100; 429/164; 429/174
(58) Field of Classification Search ............ None
See application file for complete search history.

(56) References Cited

U.S. PATENT DOCUMENTS

| 4,053,688 A | 10/1977 | Perkins et al. |
| 4,087,595 A * | 5/1978 | P. R. Mallory and Co. Inc. ............. 429/153 |
| 4,487,820 A | 12/1984 | Engelstein et al. |
| 4,535,036 A * | 8/1985 | Kelm et al. ............ 429/99 |
| 5,922,489 A * | 7/1999 | Adachi ............... 429/100 |
| 5,931,693 A | 8/1999 | Yamazaki |
| 6,062,901 A | 5/2000 | Liu et al. |
| 6,205,034 B1 | 3/2001 | Zayatz |
| 6,527,584 B1 | 3/2003 | Ninomiya |
| 2004/0038585 A1* | 2/2004 | Sugimoto et al. ........ 439/500 |

\* cited by examiner

*Primary Examiner*—John S. Maples
(74) *Attorney, Agent, or Firm*—RatnerPrestia

(57) ABSTRACT

A method and associated apparatus for preventing applying a reverse polarity voltage to an electronic circuit from a coin cell used to power such circuit by providing a first insulating wafer over the top conductive surface of a coin cell and a second insulating wafer over the bottom conductive surface of the cell. The first wafer has a central opening and the second wafer is designed to cover the portion of the bottom conductive surface corresponding to the opening of the first wafer so that when the two wafers of the protection system are placed over the coin cell with the first wafer and the insulating area positioned on the top and bottom conductive surfaces respectively, the insulating area extends fully under the first opening.

15 Claims, 3 Drawing Sheets

COIN CELL PROTECTION AGAINST REVERSE INSERTION IN CELL HOLDER

CROSS REFERENCE TO RELATED APPLICATIONS

This application claims the benefit of priority to U.S. Provisional Application No. 60/408,355, filed on Sep. 5, 2002, the contents of which are incorporated herein by reference in their entirety.

FIELD OF THE INVENTION

This invention relates to a protection method and system for a coin type battery (coin cell) used in powering an electronic circuit, and more particularly for a device that prevents a coin cell incorrectly inserted in a holder to electrically connect with the electronic circuit.

BACKGROUND OF THE INVENTION

Coin type batteries or coin cells, as are commonly known, are used in numerous applications to power electronic circuits. A coin cell typically comprises small, usually round structure having a top conducting surface that acts as a first polarity electrode contact and a bottom conductive surface which acts as a second polarity contact. Typically the surfaces form the full upper and lower parts of the cell casing, are substantially co-extensive and extend substantially parallel to each other, spaced by the thickness of the cell. Coin type batteries are particularly useful to power electronic circuits in tight spaces where the use of a regular battery is not possible due to space limitations.

U.S. Pat. No. 4,487,820 issued to Engelstein et al on Dec. 11, 1984 describes a battery holder for a coin cell type battery that is intended for use in a printed circuit application where space appears to be at a premium. U.S. Pat. No. 5,922,489 issued to Adachi on Jul. 13, 1999 and U.S. Pat. 5,931,693 issued to Yamazaki on Aug. 3, 1999 are other examples of typical battery holders for coin cells.

A problem with such holders is that, even though they typically include asymmetrically located positive and negative contact electrodes, they do not prevent a reverse polarity voltage to be applied to the electronic circuit they power if the battery is inserted upside down into the holder. Such reverse polarity voltage may prove damaging to the electronic circuit and create a malfunction, or such contact may result in shorting the battery. A protection scheme described in U.S. Pat. No. 6,205,034, discloses electronic circuitry to sense current draw anomalies, yet still allows the battery to be inserted incorrectly and end up shorting itself.

There is, therefore, still a need for a simple and inexpensive scheme that will prevent an incorrectly inserted coin cell from damaging either the associated electronic circuit which it is intended to power or itself through accidental shorting.

SUMMARY OF THE INVENTION

This invention is a protection system for a coin cell comprising spaced, substantially parallel and substantially co-extensive top and bottom conductive surfaces. In a first aspect, this system comprises:

(a) a first insulating wafer adapted to fit over the top conductive surface of a coin cell and has a first opening; and (b) a second insulating wafer adapted to fit over a portion of the bottom conducting surface of the coin cell; the second wafer comprises an insulating area.

The first opening and the insulating area are designed so that when the two wafers of the protection system are placed over the coin cell with the first wafer and the insulating area positioned on the top and bottom conductive surfaces respectively, the insulating area extends fully under the first opening.

The two wafers may be unconnected or may comprise a tab connecting the first wafer and the second wafer.

The second wafer may comprise a large insulating area covering substantially all of the bottom conductive surface and providing at least a second contact opening for contacting the bottom conducting surface of the coin cell. In such case the insulating area is larger than an area of the first opening and the second opening is located so that when the two wafers are placed over the coin cell conductive surfaces, the first opening does not overlap the second opening.

According to another aspect of this invention, there is provided a method for preventing applying a reverse polarity voltage to an electronic circuit from a coin cell used to power such circuit. This method comprises:

(a) providing a first insulating wafer over the top conductive surface of a coin cell, the first wafer comprising a first opening;

(b) providing a second insulating wafer over a portion of the bottom conducting surface of the coin cell, said second wafer comprising an insulating area;

wherein the first opening and the insulating area are designed so that when the two wafers of the protection system are placed over the coin cell with the first wafer and the insulating area positioned on the top and bottom conductive surfaces respectively, the insulating area extends fully under the first opening.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will be described with reference to the figures wherein same numerals are used to identify same elements in all figures. The figures illustrate the invention and are not intended to act as engineering or construction drawings, therefore they are not to scale and do not include all elements that may be included in such drawings, as inclusion of such elements would unduly clutter the drawings.

The invention will next be described with reference to its application in an alarm device such as an alarm device used by the banking industry to maculate currency. Even though the invention will be described with specific reference to a particular application and related environment where the invention may be used, such description is provided to facilitate an understanding of the invention by providing a specific framework and background for its use and is not intended to limit the use of this invention to a particular alarm circuit or an alarm circuit only.

In order to deter bank robberies, and to aid in the apprehension of a thief and the recovery of stolen monies, banks have been using security dye packs disguised as a strapped bundle of currency bills. Such security dye packs are normally kept in a teller drawer along with actual currency bills and are handed to a robber by the teller during a bank robbery. The top and bottom faces of the security dye pack are concealed by actual currency bills to simulate actual bundles of currency bills. The disguised security dye packs typically conceal canisters containing tear gas, dye, smoke and/or other active chemicals which can be discharged from the security dye pack to assist in the recovery of stolen monies; and to assist in the apprehension of an assailant. An electronic circuit for activation of the discharge process is included in the simulated bundle of currency bills. Such security dye packs are generally described, for example, within U.S. Pat. No. 3,303,592 issued to Harner; and within U.S. Pat. No. 3,424,122 issued to De Angelis, both of which are incorporate herein.

Figure 1:
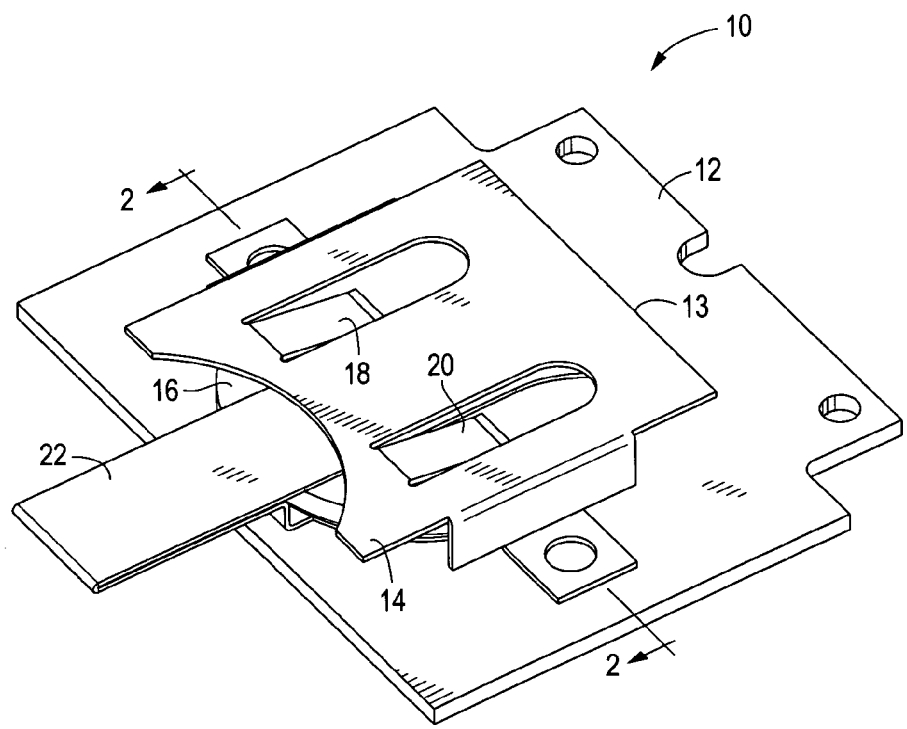
FIG. 1 shows a PC board coin cell holder with an inserted coin cell according to this invention.

The electronic circuit requires a small battery as its power source. Because it is not known how long the security pack will remain unused it is necessary from time to time to replace the coin cell used as the power source. The replacement involves removing the old coin cell from its holder in the packet and inserting a fresh cell. Because the security packet provides limited space for the electronic circuit the power cell is usually inserted in a small pocket formed on a printed circuit board. FIG. 1 illustrates a possible arrangement for holding a coin cell useful in the aforementioned alarm device.

As shown in FIG. 1 there is provided a holder 10. The holder is formed on a printed circuit board 12 and includes a pocket 14 sized to accept a coin cell 16. Two electrical contacts 18 and 20 serve the dual function of applying resilient pressure to the back surface of the coin cell 16 holding in place against the printed circuit board 12 (PC Board) and providing electrical contact with one side of the coin cell. In accordance with the present invention and as will be more fully described below, a tab 22 is provided with the coin cell according to this invention to facilitate removal of the coin cell.

Figure 2:
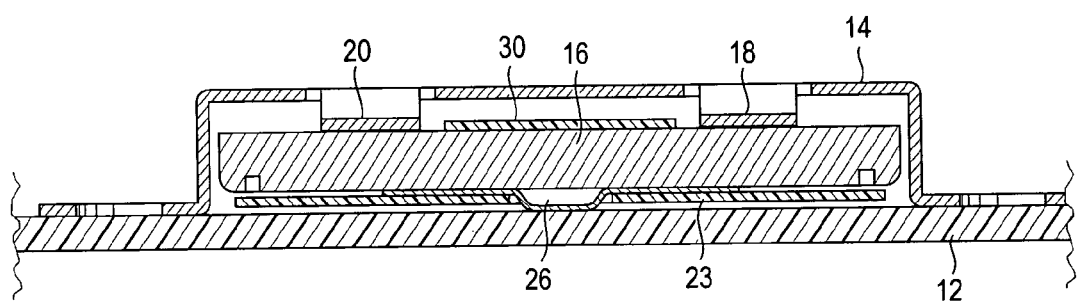
FIG. 2 shows a cross section of the holder and cell of FIG. 1 viewed along arrows 2—2.

On the side of the coin cell facing the PC board there is another electrical contact for contacting the other side of the coin cell, better shown in FIG. 2. In this particular embodiment the coin cell has been modified to provide a protruding contact 26 located in the center of the coin cell as will be described below. However it is still within the scope of this invention to have a raised contact on the PC board rather than the coin cell for contacting the coin cell 16.

Figure 3:
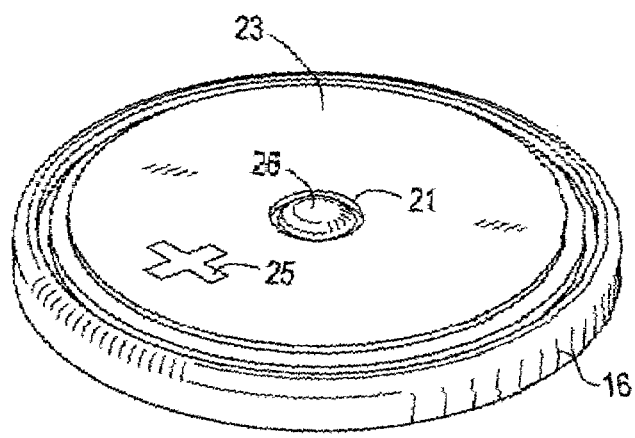
FIG. 3 shows a top wafer on a coin cell modified in accordance with the present invention.
Figure 4:
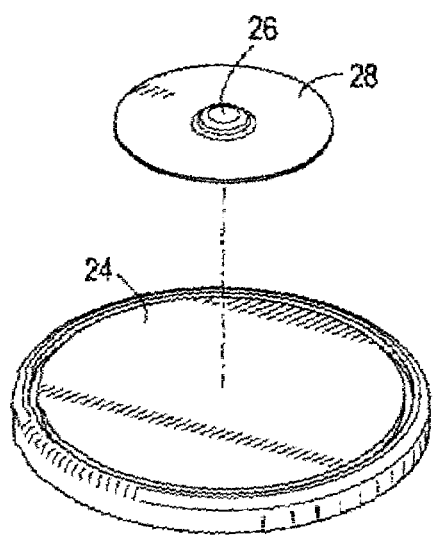
FIG. 4 illustrates the addition of a raised contact to a coin cell.

FIGS. 3 and 4 illustrate an embodiment of this invention wherein the coin cell 16 is modified by the addition of the raised contact 26 on a top, or first, conductive surface 24 of the coin cell. The raised contact may be obtained by soldering on the coin cell top conductive surface 24 a small conductive disk 28 with a raised dimple in its center forming contact 26. As shown in FIG. 3 the top conductive surface of coin cell 16 is substantially fully covered by a first insulating wafer 23. The term "substantially" as used here, means at least all coin cell conductive surface area that may contact unwanted electrical contacts if the coin cell was inserted in a wrong orientation.

First wafer 23 has an opening 21 which is located in the area corresponding to the location of the PC electronic circuit battery contact when the battery is properly inserted in the battery holder. This opening permits the electronic circuit contact to make electrical contact with the coin cell top conductive surface. When a raised contact 26 is used such as illustrated in FIG. 3, the raised contact preferably extends through the opening above the insulating wafer. Typically the wafer 23 is circular and the opening is also circular both circles being concentric.

Figure 5:
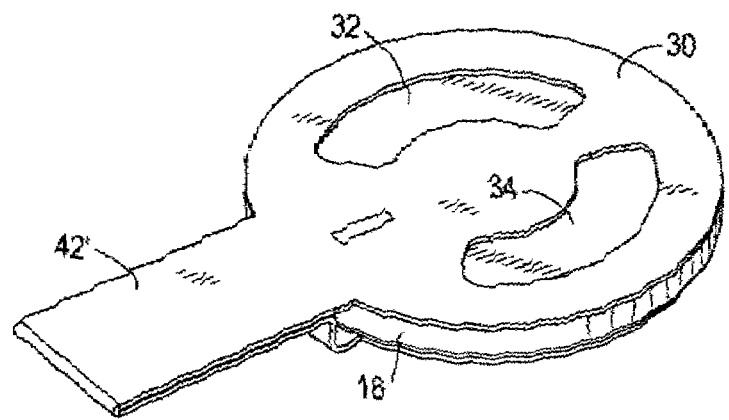
FIG. 5 shows a bottom wafer in accordance with one embodiment of the invention in use with a coin cell.

FIG. 5 shows a second insulating wafer 30 which is placed on the bottom or second conducting surface of a coin cell 16. When the coin cell is circular, the wafer 30 is also preferably circular and again is sized to cover substantially all of the bottom conductive surface. The second wafer 30 includes at least one and preferably two openings 32 and 34, through which electrode contacts 18 and 20 shown in FIG. 1 contact the conductive surface of the coin cell. As illustrated in one embodiment the openings are arcuate and co-centric with the wafer. However this is not essential as the only purpose of the openings is to permit contacts 18 and 20 to engage the conductive surface and can, therefore have any shape provided that they do not overlap the top wafer 24 opening when both top and bottom wafers 24 and 30 are positioned on the coin cell.

Figure 6:
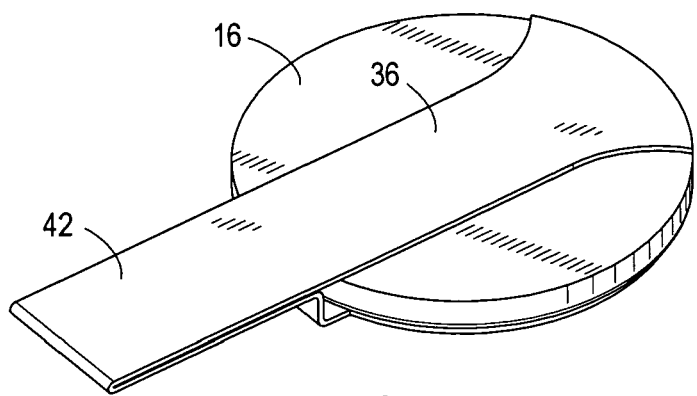
FIG. 6 shows a bottom wafer in accordance with another embodiment of the invention in use with a coin cell.

FIG. 6 shows an alternate embodiment of the bottom wafer 36 placed over the bottom conductive surface of cell 16. In this embodiment wafer 36 is devoid of openings but is instead shaped to provide an insulating layer under the opening in the top wafer when both wafers are placed on the coin cell 16.

Figure 7:
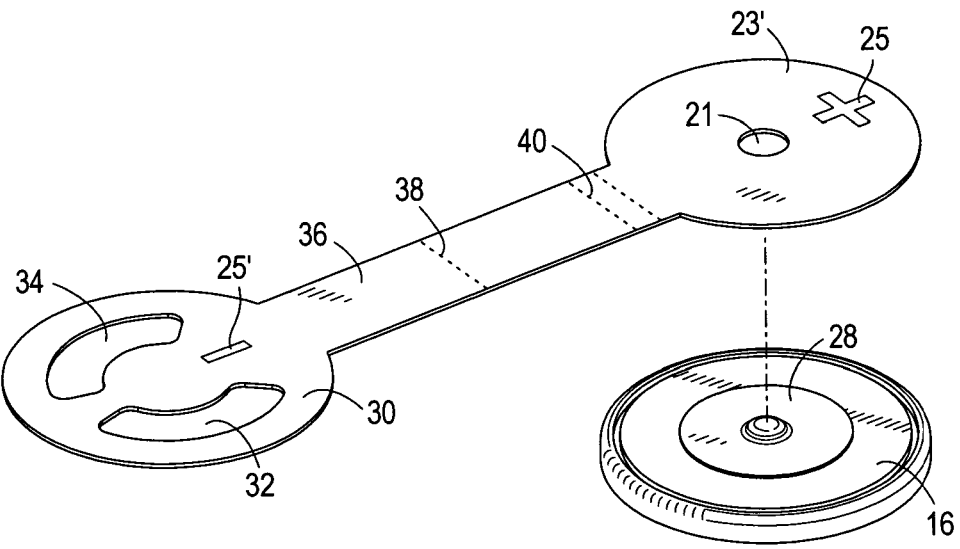
FIG. 7 shows a coin cell protection system comprising connected top and bottom wafers.
Figure 8:
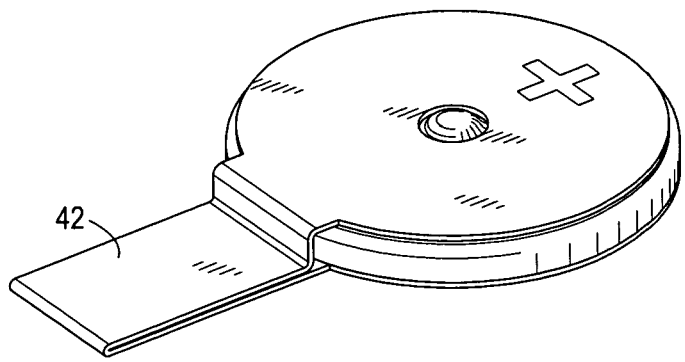
FIG. 8 illustrates the use of the connected wafers and tab on a coin cell.

Wafers 23' and 30 may be separate pieces or may be connected through a tab 36 to form a single piece as shown in FIG. 7. In one embodiment the tab 36 is designed to fold along fold lines 38 and 40 to form a protruding handle 42 extending on a side of the coin cell, as illustrated in FIG. 8. Preferably an adhesive is provided on one side of the wafers to secure the wafers onto the conductive surface of the coin cell. Again preferably the adhesive may be covered with a peelable protective sheet which is removed prior to the application of the wafer on the coin cell.

When two separate wafers are used, the two wafers are each glued on the top and bottom surface of the coin cell respectively. When the wafers are connected with a tab, the tab is folded along the fold lines and the wafers again glued over the top and bottom conductive surfaces of the coin cell. Care should be exercised to assure that the proper wafer is placed on the proper surface. To prevent reversing the wafers indicia 25 and 25' may be provided on their surface to indicate which goes where. Such indicia may be as simple as a polarity indicator or may include additional instructions.

As shown in the embodiment illustrated in FIG. 8, the tab 36 may be designed to fold along fold lines 38 and 40 to form a handle 42 extending from the coin cell to permit easy removal of the cell after the cell has been inserted in a holder such as shown in FIG. 1. Similarly when the wafers are individual pieces the handle may be formed by a tab 42' integral with the bottom wafer only. Typically the handle should extend about at least a ¼ inch or so, to permit grasping it and pulling the coin cell out of the holder.

When there is no handle present, or as an added precaution, the wafers preferably include some identification of the proper orientation used to insert the coin cell into the holder so that proper contact is made with the electrical connectors of the associated circuit through the uncovered areas. Such identification may be as simple as the provision of visible indicia on the wafers or the modification of the cell to provide tactile or visible identification of the proper orientation.

The attached figures and the accompanying description illustrate the invention, which in a more general form is also a method for protecting a battery and associated electronic circuits from the effects of an incorrectly inserted coin cell in an associated battery holder. Protection is obtained by preventing applying a reverse polarity voltage to the electronic circuit from the coin cell by providing a first insulating wafer with a first opening over the top conductive surface of the coin cell and a second insulating wafer over a portion of the bottom conducting surface. The bottom insulating area is designed to provide open areas for contacting the bottom conductive surface of the cell but the opening on the top insulating wafer and the open areas in the bottom insulating wafer are located so as not to overlap.

The design shown in the attached figures prevents accidental damage such as shorting from incorrectly inserting a coin cell battery, as shown and explained herein, because the contact pads would contact the insulator if the battery is inserted in reverse position. The presence of the tabs permits easy orientation and removal of the battery for replacement. Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A protection system for a coin cell comprising spaced, substantially parallel and substantially co-extensive top and bottom conductive surfaces said system comprising:
   a first insulating wafer adapted to fit over said top conductive surface of said coin cell said first wafer comprising a first opening;
   a second insulating wafer adapted to fit over a portion of said bottom conducting surface of said coin cell, said second wafer comprising an insulating area extending fully under the first opening and a second opening located so that when the two wafers are placed over the coin cell conductive surfaces, the first opening does not overlap the second opening;
   and
   wherein said coin cell is designed to fit in a cell holder having upper and lower contact electrodes designed to contact said top and bottom conductive surfaces respectively in non overlapping areas and wherein said openings in said top and bottom wafers are positioned so that when said insulating wafers are placed over a coin cell adapted to fit said coin cell holder, said upper and lower electrodes contact said top and bottom conducting surfaces respectively through said wafer openings when said battery is inserted in a first orientation in said holder and contact the insulating wafer when said coin cell is inserted in said holder in a second, inverted orientation.

2. The protection system of claim 1 further comprising a tab connecting said first wafer and said second wafer.

3. The protection system of claim 1 wherein said first and said second wafers are generally circular each comprising a center and having dimensions commensurate with said coin cell top and bottom conducting surfaces respectively, and wherein said first wafer opening encompasses said first wafer center and second wafer comprises two openings positioned symmetrically around said second wafer center outside of said second wafer center.

4. The protection system of claim 2 wherein said tab is longer than a thickness of said coin cell whereby when said top and said bottom wafers are placed on said top and said bottom coin cell conducting surfaces said tab extends from one side of said coin cell at least ⅛ inches.

5. A method for preventing applying a reverse polarity voltage to an electronic circuit from a coin cell used to power said circuit the ,method comprising:
   providing a first insulating wafer over a top conductive surface of said coin cell
   said first wafer comprising a first opening;
   providing a second insulating wafer over a portion of a bottom conducting surface of said coin cell, said second wafer comprising an insulating area extending fully under the first opening and a second opening located so that when the two wafers are placed over the coin cell conductive surfaces, the first opening does not overlap the second opening;
   and
   wherein said coin cell is designed to fit in a cell holder having upper and lower contact electrodes designed to contact said top and bottom conductive surfaces respectively in non overlapping areas and wherein said openings in said top and bottom insulating are positioned so that when said insulating are placed over a coin cell adapted to fit said coin cell holder said upper and lower electrodes contact said top and bottom conducting surfaces respectively through said wafer openings when said battery is inserted in a first orientation in said holder, and contact the insulating wafer when said coin cell is inserted in said holder in a second, inverted orientation.

6. A coin cell comprising a top conductive surface representing an electrical contact of a first polarity and a substantially parallel bottom conductive surface representing an electrical contact of a second polarity, said top conducting surface being substantially parallel to said top conductive surface, and
   a first insulating wafer on said top conductive surface covering substantially all of said top conductive surface said first insulating wafer comprising a first opening exposing a portion of said top conductive surface and
   a second insulating wafer on said bottom conducting surface completely covering at least an area on said bottom conducting surface opposite said first opening on said top conductive surface whereby exposed areas in said top and said bottom conductive surfaces do not overlap.

7. The coin cell of claim 6 wherein said second insulating wafer covers substantially all of said second conducting surface said second insulating wafer also comprising an second opening exposing a portion of said bottom conducting surface, said first opening does not overlap said second opening.

8. The coin cell according to claim 7 wherein said top surface is circular and has a center and said first opening is also circular and is located substantially in the center of the top conductive surface, and wherein said bottom surface also comprises a center and the second wafer opening is an off center arcuate opening.

9. The coin cell battery according to claim 6 wherein said top surface includes a raised contact and said raised contact extends through said first wafer opening.

10. The coin cell according to claim 6 wherein said first and said second insulating wafers are interconnected with a connecting tab.

11. The coin cell according to claim 10 wherein said tab extends along a side of said coin cell.

12. The coin cell according to claim 6 wherein said first and said second wafers are removably attached to said coin cell.

13. The coin cell according to claim 6 wherein said coin cell is designed to fit in a cell holder having upper and lower contact electrodes designed to contact said top and bottom conductive surfaces respectively and wherein said openings in said top and bottom wafers are positioned so that when said cell is inserted in a first orientation in said holder said upper and lower electrodes contact said top and bottom conducting surfaces through said first and second wafer openings respectively and contact the insulating wafer when said coin cell is inserted in said holder in a second, inverted orientation.

14. The coin cell according to claim 9 wherein said top conductive surface is substantially planar and said raised contact is attached to said planar top surface substantially on said top surface center.

15. The coin cell according to claim 7 wherein said second wafer comprises two arcuate openings located symmetrically around said bottom surface center.

* * * * *